United States Patent [19]
Vander Mey

[11] 3,859,182
[45] Jan. 7, 1975

[54] COATING PRINTED CIRCUIT BOARDS WITH TIN OR TIN-LEAD ALLOY AND TIN-LEAD FLUOBORATE PLATING BATHS

[75] Inventor: John E. Vander Mey, Stirling, N.J.

[73] Assignee: Allied Chemical Corporation, New York, N.Y.

[22] Filed: Jan. 4, 1973

[21] Appl. No.: 321,092

[52] U.S. Cl. .................. 204/24, 204/43 S, 204/54 R
[51] Int. Cl. ....... C23b 5/14, C23b 5/38, C23b 5/46
[58] Field of Search ............ 204/43 S, 24, 53, 54 R

[56] References Cited

UNITED STATES PATENTS

| | | | |
|---|---|---|---|
| 1,452,573 | 4/1923 | Simpkins | 204/54 R |
| 2,460,252 | 1/1949 | DuRose et al. | 204/43 S |
| 3,554,878 | 1/1971 | Rothschild | 204/43 S |

FOREIGN PATENTS OR APPLICATIONS

| | | | |
|---|---|---|---|
| 2,050,145 | 6/1971 | Germany | 204/43 S |
| 1,151,460 | 5/1969 | Great Britain | 204/43 S |

OTHER PUBLICATIONS

A. E. Carlson, Plating, pp. 1,149–1,150, Sept. 1955.

*Primary Examiner*—G. L. Kaplan
*Attorney, Agent, or Firm*—Jay P. Friedenson; Michael L. Dunn

[57] ABSTRACT

The plating bath of the invention is an aqueous plating bath comprising, per liter of bath, from about 150 to about 700 grams of bath of fluoboric acid; from about 2 to about 15 grams of a plate modifying additive, preferably an amino acid chain compound; from about 15 to about 82 grams of metal selected from stannous tin or a mixture of stannous tin and lead, which mixture contains at least 5 weight percent tin, and from about 0.01 to about 1 gram of beta-naphtol. An electrically conductive substrate is plated with tin or a tin-lead alloy by immersing the substrate in the above plating bath at a temperature between about 50° and 100° F. and applying sufficient negative voltage to the substrate relative to an anode within the bath to cause a current density at the substrate of between about 7 and about 35 amperes per square foot.

15 Claims, 2 Drawing Figures

COATING PRINTED CIRCUIT BOARDS WITH TIN OR TIN-LEAD ALLOY AND TIN-LEAD FLUOBORATE PLATING BATHS

BACKGROUND OF THE INVENTION

This invention relates to plating baths having high throw power and more practically relates to plating baths having high throw power which are suitable for plating electronic circuit boards at high current densities. "Plating bath" as used herein means any liquid bath into which a substrate is immersed which substrate is to be electrically plated with a metal.

Originally, electronic circuits were formed by connecting wires between electronic components. This method of forming electronic circuits was inefficient and wasteful in that as electronic circuits become more complex, the manual connecting of wires between electronic components required large numbers of man-hours. In addition, the wires in complex electronic circuits required large amounts of space; thus, miniaturization of electronic circuits was not possible. Furthermore, the large number of wires required in the complex circuits substantially increased the circuit cost.

In more recent years circuit boards have been utilized in manufacturing complex electronic circuits. The circuit boards are manufactured by placing an electrically conductive metallic coating on a surface of an insulating board through which holes have been placed. A portion of the metallic coating is then removed through etching or other means leaving a pattern of electrically conducting paths of metal on the insulating board. Electronic components are placed into the holes from the surface opposite the surface containing the pattern of electrically conducting paths. The electronic component is then soldered to the electrically conductive paths to form an electronic circuit.

Attempts were made to form the metallic coating on a surface of the circuit board through electrical plating techniques, however, a problem was encountered in that plating inside of the holes in the board was not satisfactory, since the holes did not form a part of the most direct electrical path for the plating current passing through the plating bath. It is desirable to have the internal surface of the holes satisfactorily plated so that a good electrical connection will be made between the electrically conductive paths and the leads passing through the holes in the circuit board.

Recently it has been found that raising the concentration of acid in the plating bath and lowering the concentration of metal in the plating bath resulted in a plating bath having high "throw power." "Throw power" is an indication of the tendency of a plating bath to form a metallic plate on a substrate which substrate does not form a part of the shortest electrically conductive path through the plating bath. "Throw power" is the ratio of the weight of metallic deposit per unit area on the substrate surface which does not form a part of the most direct electrically conductive path through the plating bath divided by the weight of metallic plate deposits per unit area on a substrate which does form a part of the most direct electrically conductive path through the plating bath.

When the metal being plated from the plating bath having high throw power is copper, high plating speeds can be obtained since current densities as high as 30 amperes per square foot can be used even with low copper concentration. Plating speed increases as the current density through the bath increases.

Unfortunately, in the prior art, when the metal being plated onto the substrate was tin or a tin-lead alloy, high current densities in the plating bath having high throw power (high throw bath) could not be obtained since the high throw bath for plating tin or tin-lead alloy did not have sufficient current carrying capacity due to the low tin or tin and lead metal concentration required in the bath to obtain the high throw power. Plating of tin or tin-lead alloy on the surface of the circuit board and in the holes of the circuit board was required to increase solderability.

The plating bath of the invention is a high throw tin or tin-lead alloy plating bath, which unlike high throw tin or tin-lead plating baths of the prior art, can operate at high current densities and has greater throw power than any prior art tin or tin-lead plating bath at all current densities up to about 35 amperes per square foot. As a result of the higher permissible current densities in the high throw bath of the invention, substrates can be plated from the bath at higher speeds than were obtainable using prior art plating baths.

The method of the invention can be used for plating an electrically conductive substrate at high speed while effectively plating portions of the substrate which do not form a part of the most direct electrical path through the plating bath.

BRIEF DESCRIPTION OF THE INVENTION

The plating bath of the invention is an aqueous plating bath comprising per liter of bath from about 150 to about 700 grams of fluoboric acid; from about 2 to about 15 grams of a plate modifying additive, preferably an amino acid chain compound; from about 15 to about 82 grams of metal, which metal is selected from stannous tin or a mixture of stannous tin and lead, which mixture contains at least 5 weight percent tin; and from about 0.01 to about 1 gram of beta-naphthol. The method for plating an electrically conductive substrate with tin or a tin-lead alloy comprises immersing the substrate in the above plating bath at a temperature between about 50° and 100° F. and applying sufficient negative voltage to the substrate relative to an anode within the bath to cause a current density at the substrate of between about 7 and about 35 amperes per square foot. The anode is preferably manufactured from a material selected from tin and a tin-lead alloy which alloy contains at least 5 weight percent tin. As used herein "amino acid chain compound" means an amino acid chain having a molecular weight of at least 500 formed by interaction between amine groups and carboxyl groups of amino acids. There are as many amino acid compounds in the chain as are necessary to reach the required molecular weight. An amino acid in the chain may be structurally the same as or structurally different than other amino acids in the chain. "Amino acid chain compound" is intended to include polypeptides, proteins and mixtures thereof.

DETAILED DESCRIPTION OF THE INVENTION

In order to make the bath of the invention, it is desirable that 50 percent of the required water be introduced into a tank. Where a tin-lead bath is desired, the required amount of a concentrated solution of a lead salt, preferably lead fluoborate, is then introduced into the tank. Similarly, a concentrated solution of fluoboric acid and a concentrated solution of a stannous salt, preferably stannous fluoborate, are added to the solution of water and lead fluoborate. The required amount of amino acid chain compound is then added and a sufficient quantity of water is introduced to reach the desired volume.

The fluoboric acid is maintained in the bath to provide the required acidity, which will help give a fine-grained plate. "Plate" as used herein means the metal layer electrically deposited on the substrate. An acid concentration of from about 150 to about 700 grams per liter is required in order for the bath to have sufficient throw power. An acid concentration below about 150 grams per liter generally results in a plating bath which does not provide sufficient throw power for the plating of the holes in an electronic circuit board. Acid concentrations above about 700 grams per liter are not necessary and can cause the formation of gas within the plating bath which is undesirable. A preferred acid concentration range is between about 200 grams per liter and about 500 grams per liter, and more preferably between about 350 and about 450 grams per liter, since if the acid concentration falls below 350 grams per liter the throw power of the bath tends to decrease and concentrations in excess of 450 grams per liter will generally have no significant effect on throw power. The fluoboric acid, $HBF_4$, is generally added in the form of a concentrated (49%) aqueous solution. The amount of concentrated fluoboric acid solution which is added is the amount required to provide the equivalent of from about 150 to about 700 grams per liter of fluoboric acid based upon the dry weight of the acid.

The metal in the plating bath is introduced in the form of an aqueous solution of the soluble metal salt. The preferred metal salt is the metal fluoborate. The amount of metal which is required in the plating bath, based upon the weight of metal rather than upon the weight of metal salt, is between about 15 and about 82 grams per liter of bath. At least about 15 grams per liter of metal is required so that current densities of at least 10 amperes per square foot can be obtained. Lower current densities result in plating times which are generally considered unacceptably slow. The maximum amount of metal permissable in the plating bath is limited by solubility and by metal losses resulting from removal of metal from the bath by plated substrates in a dissolved rather than plated form, since some of the plating bath solution will cling to the substrates as they are removed from the plating bath. Such removal of metal from the plating bath is known as "drag out". Metal loss through "drag out" is reduced when metal concentrations are lower. A more preferred metal concentration in the plating bath is between about 20 grams per liter and about 75 grams per liter. Metal concentrations of about 20 grams per liter or higher permit higher current densities which permit higher plating speeds. Metal concentrations above about 75 grams per liter result in some decrease in the throw power of the bath. Metal concentrations between about 20 and about 45 grams per liter are generally considered even more preferred in that sufficient current densities can be obtained, metal losses through "drag out" are minimized and throw power of the bath is maximized. In the operation of this invention about 30 to about 45 grams per liter of metal in the bath is most preferred.

The bath of this invention can be used for plating tin or tin-lead alloys. Although substantially pure tin can be easily plated from the bath, substantially pure lead cannot be plated from the bath of the invention in that dark plates are obtained. It has been found that when the metal in the bath is a mixture of about 95% lead and about 5% tin, satisfactory plates are obtained. A particularly good mixture of metals in the bath for obtaining plates having excellent solderability contains about 60% tin and about 40% lead. It is to be understood that the tin salts in the bath are always the stannous tin salts rather that the stannic tin salts since the presence of stannic tin salts in the bath reduces the quality of the plate. The preferred tin salt is stannous fluoborate, $Sn(BF_4)_2$. The preferred lead salt is lead fluoborate, $Pb(BF_4)_2$.

From about 2 to about 15 grams per liter of an amino acid chain compound which is preferably selected from peptone, animal glue, gelatin and protein power is incorporated into the bath to promote the formation of adherent, fine-grained plate deposits. Acceptable deposits may be obtained when other plate modifying additives known in the art, such as water soluble waxes and hydroquinone are used; however, the best deposits are obtained when the plate modifying additive is an amino acid chain compound. If less than about 2 grams per liter of an amino acid chain compound or other plate modifying additive known in the art is used, then the deposit becomes rough and the plate on the substrate is not uniform. If over about 15 grams per liter of the plate modifying additive is used, then unsatisfactory dark plates occur. The quality of the plate is maximized when an amino acid chain compound is present in the bath in an amount between about 2 and about 7 grams per liter. The most preferred amino acid chain compound is peptone. The peptone can be measured and poured directly into the bath or can be added in aqueous solution. The bath should be stirred gently to ensure complete mixing of the peptone.

It is known in the prior art that the previously mentioned fluoboric acid, tin fluoborate, lead fluoborate and fluoboric acid components could be incorporated into a plating bath to obtain a high throw bath when the metal concentrations were about 20 grams per liter or less, it has now been discovered that metal concentrations in excess of about 20 grams per liter and as high as about 82 grams per liter can be employed to obtain a high throw bath provided beta-naphthol is used as an additive. The higher metal concentrations permit current densities up to about 35 amperes per square foot to be used in the plating bath. The increased current densities in turn permit higher plating speeds. It has been found that from about 0.01 to about 1 gram per liter of bath of beta-naphthol will improve the throw power of a plating bath containing tin or a mixture of tin and lead over prior art plating baths having the same percentages of the same components, except beta-naphthol. The throw power of the prior art plating bath through the addition of beta-naphthol is improved when low current densities or high current densities up to about 35 amperes per square foot are used. When less than about 0.01 gram per liter of beta-naphthol is used, little improvement in throw power is noticed. The maximum amount of beta-naphthol which can be used in the plating bath is limited by the solubility of beta-naphthol in the bath. In addition, high concentrations of beta-naphthol increase the tendency for undesirable gas formation at the cathode in the plating bath. The preferred range for the amount of beta-naphthol used in the bath is from about 0.05 to about 0.5 gram per liter. When lower acid concentrations, e.g. below about 300 grams per liter of plating bath is used, the tendency for the beta-naphthol to cause gas formation is reduced and higher beta-naphthol concentrations can be used.

Optionally, boric acid may be added to the plating bath to maintain bath stability since boric acid stabilizes the $BF_4^-$ ion to prevent the formation of hydrogen fluoride. Approximately 25 grams per liter of bath of boric acid has been found desirable, but its concentration is not critical and any amount of boric acid from 0 percent to its saturation solubility in the plating bath can be used. The saturation solubility of boric acid in the plating bath is dependent upon the acid concentration in the bath. Boric acid is soluble in the plating bath of the invention in an amount of about 36 grams per liter of bath when the acid concentration is about 150 grams per liter, and is soluble in the bath of the invention in an amount of about 28 grams per liter when the acid concentration is about 350 grams per liter of bath. Boric acid concentrations as low as about 10 grams per liter have been found to be beneficial in stabilizing the plating bath for extended periods.

The amount of water used in the bath is the quantity sufficient to increase the amount of the bath to the desired volume. The water is incorporated to maintain the fluoboric acid, amino chain compound, metal, beta-naphthol and boric acid components in their previously discussed concentrations.

The plating bath of the invention is used by immersing in the bath a substrate, such as a printed circuit board, to be plated and applying a sufficient negative voltage to the substrate relative to an anode within the plating bath to cause a current density at the substrate of between about 7 and about 35 amperes per square foot. The anode is manufactured from a material selected from tin and a tin and lead alloy containing at least 5 weight percent tin. The composition of the anode preferably contains tin and lead in the same ratio as the ratio of tin and tin and lead in the plated deposit.

The substrate must be electrically conductive and in the case of an electrical printed circuit board, may be made electrically conductive by chemical deposition of a metal on a surface of the printed circuit board, by vapor deposition of the metal on a surface of the circuit board or by adhering a thin metal foil to a surface of the printed circuit board. The electronically conductive substrate may comprise one or a plurality of electrically conductive surfaces each of which defines a hole through a printed circuit board. In other words the surface of the hole may form a part of the electrically conductive substrate.

Current densities of from about 7 to about 35 amperes per square foot can be used. Current densities of less than about 7 amperes per square foot result in plating times which are unacceptably slow while current densities in excess of about 35 amperes per square foot result in plates which do not have the required solderability. Current densities between about 15 and about 35 amperes per square foot are preferred in that higher plating speeds are obtained and current densities between about 25 and about 30 amperes per square foot are most preferred in that high plating speeds are obtained and the resulting plate has excellent solderability.

The temperature of the plating bath is not critical, however, generally the temperature should be between about 50° and 150° F. and more preferably between about 60° and 100° F. The most preferred plating temperature is about 75° F.

Plating time is dependent upon current density and upon the thickness of plate desired. In operation, when the plate required is less than about 0.01 inch, the plating time may be between about 1 and about 45 minutes and is preferably between about 1 and about 30 minutes. The high throw plating bath of this invention may be used to obtain plating thickness as high as about 0.001 inch in less than about 15 minutes, which was not possible with prior art high throw tin or tin-lead plating baths. The preferred range of plate thickness to provide a coating to improve solderability is between about 0.0001 and about 0.0003 inch. At current densities between about 25 and about 35 amperes per square foot, in accordance with this invention, plating times may be less than 5 minutes. Longer times are required when lower current densities are used; however, when lower current densities are used in the bath of this invention, substantially higher throw power is obtained than was possible with prior art tin or tin-lead high throw plating baths at a similar current density.

The tin or tin-lead plating baths of the present invention which contain beta-naphthol have been found to exhibit unexpectedly high throw power in their ability to plate the holes in printed circuit boards and fill small imperfections in the board or hole surface to provide a level tin or tin-lead alloy plate, as compared to prior art tin or tin-lead alloy plating baths which do not contain beta-naphthol. The ratio of the plate thickness on the printed circuit board (board to hole ratio) to the plate thickness on the electrically conductive surface which defines a hole through the printed circuit board for high throw tin or tin-lead alloy plating baths of the prior art generally ranged from about 1:1 to 1.25:1 at current densities of 20 amperes per square foot or below. When current densities above 20 amperes per square foot were used in prior art high throw plating baths for tin or tin-lead alloy, throw power was substantially reduced or plates were unsatisfactory. The board to hole ratios for the plating baths of this invention generally do not fall below 1:1 at any current density up to 35 amperes per square foot which permits substantially higher plating speeds and attainment of high quality plates.

Figure 1:
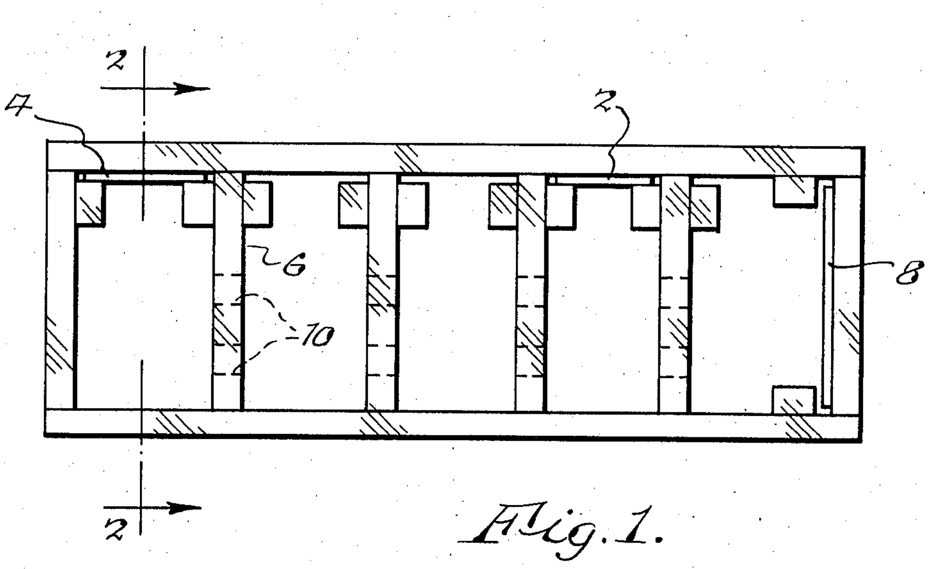
FIG. 1 is a plan view of the test cell used in the examples to determine throw power measurements of plating baths.
Figure 2:
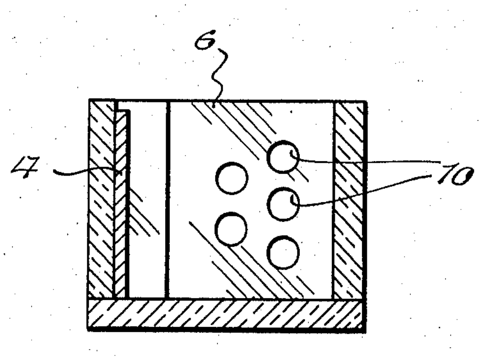
FIG. 2 is an elevational view of one of the partition walls of the test cell, through cutting plane 2—2 of FIG. 1.

The operation of the cell shown in FIG. 1 is somewhat similar in principle to the operation of the Haring-Bloom Cell usually employed for throw power measurement. However, unlike the Haring-Bloom Cell, this cell has a multiplicity of compartments (five are shown in FIG. 1) within which the cathodes, 2 and 4, which are to be plated, are placed against the side of the cell. The plating bath flows through the compartments through the 5¼ inch holes, 10, drilled into each compartment partition, 6. This partition is shown in FIG. 2. The percent "throw power" is calculated by dividing the weight of the deposit of the panel (cathode), 2, closest to the anode, 8, into the weight of the deposit of the panel (cathode), 4, away from the anode. The volume of bath used in the test cell is approximately 250 milliliters. In the examples presented below, all of the throw power determinations of the baths are tested in the above-described test cell.

In all of the following examples, the listed components are blended in 500 milliliters of demineralized water. A sufficient quantity of additional demineralized water is then added to make 1 liter of plating bath. Two hundred and fifty milliliters of the plating bath is then tested for throw power in the above-described test cell. The substrates plated in the tests are brass sheets having a thickness of about 0.015 inch and dimensions of 1⅛ inches by 2½ inches. The plating time in the test cell is 10 minutes and all tests are run at room temperature. The cell is made with ¼ inch polymethylmethacrylate. The following examples set out in Table I clearly indicate that superior throw power is obtainable at all metal concentrations using the plating bath of this invention which contains beta-naphthol when compared with the throw power of prior art tin or tin-lead alloy plating baths without beta-naphthol.

The following examples also clearly indicate that the addition of beta-naphthol to the plating bath permits a combination of both high throw power and high metal concentrations (e.g. above about 30 grams per liter of metal), a combination which was not obtainable in prior art plating baths. The use of high metal concentrations permitted by the present invention allows high current densities to be used in the plating baths, thus higher plating speeds are obtainable.

In all examples, the tin and lead are introduced into the baths in the form of 51% by weight aqueous solutions of stannous and lead fluoborate, respectively. Fluoboric acid is introduced as a 49% by weight aqueous solution. In Table I, tin and lead are given in grams per liter. The grams of stannous or lead aqueous solution which is incorporated into the bath can be calculated by multiplying the grams per liter of tin and the grams per liter of lead by 4.83 and 3.60, respectively.

TABLE I

| COMPONENT | TIN g/l | LEAD g/l | FLUOBORIC ACID g/l | PEPTONE g/l | GELATIN g/l | BORIC ACID g/l | B-NAPHTHOL g/l | CURRENT DENSITY A.S.F | % THROW POWER | OBSERVATIONS |
|---|---|---|---|---|---|---|---|---|---|---|
| Example | | | | | | | | | | |
| 1 | 15 | 10 | 400 | 5 | — | — | — | 7 | 38 | |
| 2 | 15 | 10 | 400 | 5 | — | — | 1.0 | 7 | 81 | |
| 3 | 15 | 10 | 400 | — | 6 | — | 1.0 | 7 | 75 | |
| 4 | 15 | 10 | 400 | — | 6 | — | — | 7 | 34 | |
| 5 | — | 10 | 400 | — | 6 | — | 1.0 | 7 | 73 | Dark Deposit No Good |
| 6 | 25 | — | 400 | 5 | — | — | — | 7 | 19 | |
| 7 | 25 | — | — | 5 | — | — | 1.0 | 7 | 80 | |
| 8 | 15 | — | 400 | — | 6 | — | 1.0 | 7 | 83 | |
| 9 | 15 | 10 | 400 | 5 | — | — | — | 15 | 59 | |
| 10 | 15 | 10 | 400 | 5 | — | — | — | 15 | 51 | |
| 11 | 15 | 10 | 400 | 5 | — | — | — | 15 | 42 | |
| 12 | 15 | 10 | 400 | 5 | — | — | 1.0 | 15 | 56.5 | |
| 13 | 15 | 10 | 400 | 5 | — | — | 0.5 | 15 | 53 | |
| 14 | 15 | 10 | 400 | 5 | — | — | 0.2 | 15 | 55.5 | |
| 15 | 15 | 10 | 400 | 5 | — | — | 0.1 | 15 | 52.5 | |
| 16 | 15 | 10 | 400 | 5 | — | — | 0.05 | 15 | 50.5 | |
| 17 | 15 | 10 | 400 | 5 | — | — | 0.02 | 15 | 53.5 | |
| 18 | 20 | 25 | 200 | 5 | — | — | — | 15 | 33.6 | |
| 19 | 20 | 25 | 200 | 5 | — | — | 0.5 | 15 | 53.0 | |
| 20 | 20 | 25 | 200 | 5 | — | — | — | 30 | 32.4 | |
| 21 | 20 | 25 | 200 | 5 | — | — | 0.5 | 30 | 43.0 | |
| 22 | 20 | 25 | 200 | 5 | — | — | — | 45 | 36.8 | Poor Solderability |
| 23 | 20 | 25 | 200 | 5 | — | — | 0.5 | 45 | 33.0 | do. |
| 24 | 20 | 25 | 350 | 5 | — | — | — | 15 | 39.7 | |
| 25 | 20 | 25 | 350 | 5 | — | — | 0.5 | 15 | 61.5 | |
| 26 | 20 | 25 | 350 | 5 | — | — | — | 30 | 38.5 | |
| 27 | 20 | 25 | 350 | 5 | — | — | 0.5 | 30 | 46.8 | |
| 28 | 20 | 25 | 350 | 5 | — | — | — | 45 | 41.0 | Poor Solderability |
| 29 | 20 | 25 | 350 | 5 | — | — | 0.5 | 45 | 38.5 | do. |
| 30 | 20 | 25 | 350 | 5 | — | — | — | 35 | 39.5 | Good Solderability |
| 31 | 20 | 25 | 350 | 5 | — | — | 0.5 | 35 | 44 | do. |
| 32 | 38 | 37 | 200 | 5 | — | — | — | 30 | 26 | |
| 33 | 38 | 37 | 200 | 5 | — | — | 0.25 | 30 | 34 | |
| 34 | 46 | 29 | 350 | 5 | — | — | — | 30 | 27 | |
| 35 | 46 | 29 | 350 | 5 | — | — | 0.25 | 30 | 36 | |
| 36 | 20 | 25 | 500 | 5 | — | — | 0.5 | 15 | 65 | |
| 37 | 20 | 25 | 500 | 5 | — | — | — | 15 | 42 | |
| 38 | 20 | 25 | 700 | 5 | — | — | 0.5 | 15 | 65 | |
| 39 | 20 | 25 | 700 | 5 | — | — | — | 15 | 43 | |
| 40 | 3 | 44 | 200 | 0.5 | — | 25 | — | 15 | 28.8 | |
| 41 | 3 | 44 | 200 | 0.5 | — | 25 | 0.25 | 15 | 32.0 | |
| 42 | 3 | 44 | 200 | 0.5 | — | 25 | — | 30 | 29.6 | Dark Plate Unacceptable |
| 43 | 3 | 44 | 200 | 0.5 | — | 25 | 0.25 | 30 | 36.0 | Good Plate |

1. g/l = grams per liter
2. A.S.F. = amperes per square foot

What is claimed is:

1. An acidic aqueous plating bath comprising the following component concentrations per liter of bath:

from about 350 to about 450 grams of free fluoboric acid;

from about 2 to about 15 grams of an amino acid chain compound;

from about 0.01 to about 1 gram of beta-naphthol; and from about 15 to about 82 grams of metal, said metal being selected from stannous tin or a mixture of stannous tin and lead, said mixture containing at least 5 weight percent tin.

2. The plating bath according to claim 1 wherein said amino acid chain compound is peptone.

3. The plating bath according to claim 2 wherein said peptone is present in an amount between about 2 to about 7 grams.

4. The plating bath according to claim 2 wherein the beta-naphthol is present in an amount between about 0.05 and about 0.5 gram.

5. The plating bath according to claim 1 wherein said metal is present in an amount between about 30 and about 45 grams.

6. The plating bath according to claim 1 wherein there is additionally included boric acid in an amount from about 10 to about 36 grams.

7. A method for plating an electrically conductive substrate with tin or a tin and lead alloy a portion of which substrate does not form a part of the path of least resistance to current flow, comprising:

immersing said substrate in an acidic aqueous plating bath at a temperature between about 50° and about 150° F., said plating bath comprising per liter of bath from about 350 to about 450 grams per liter of free fluoboric acid; from about 2 to about 15 grams per liter of an amino acid chain compound; from about 15 to about 82 grams per liter of metal, said metal being selected from tin and a mixture of stannous tin and lead, said mixture containing at least 5 weight percent tin; and from about 0.01 to about 1 gram per liter of bath of beta-naphthol; and applying sufficient negative voltage to said substrate relative to an anode within said bath to cause a current density at said substrate of between about 7 and about 35 amperes per square foot.

8. The method according to claim 7 wherein said amino acid chain compound is peptone.

9. The method according to claim 8 wherein said voltage is applied for from about 1 to about 45 minutes.

10. The method according to claim 9 wherein said metal is present in an amount between about 30 grams and 45 grams per liter.

11. The method according to claim 10 wherein the beta-naphthol is present in amount of from about 0.05 to about 0.5 gram.

12. The method according to claim 11 wherein from about 2 to about 7 grams of peptone per liter of plating bath are present.

13. The method according to claim 12 wherein the current density is from about 15 to about 35 amperes per square foot.

14. The method according to claim 13 wherein said voltage is applied for from about 1 to about 30 minutes.

15. The method according to claim 7 wherein said electrically conductive substrate comprises at least one electrically conductive surface which defines a hole through an electrical printed circuit board.

* * * * *